(12) United States Patent
Stephan

(10) Patent No.: US 6,801,031 B1
(45) Date of Patent: Oct. 5, 2004

(54) METHOD AND APPARATUS FOR CURRENT MEASUREMENT FOR ELECTRONICALLY-CONTROLLED PUMP

(75) Inventor: Waldemar Stephan, Dortmund (DE)

(73) Assignee: Wilo GmbH, Dortmund (DE)

( * ) Notice: Subject to any disclaimer, the term of this patent is extended or adjusted under 35 U.S.C. 154(b) by 0 days.

(21) Appl. No.: 09/388,813

(22) Filed: Sep. 1, 1999

(30) Foreign Application Priority Data

Sep. 4, 1998 (DE) .......................... 198 40 479

(51) Int. Cl.[7] .............................................. G01R 19/00
(52) U.S. Cl. ................ 324/126; 324/117 R; 324/158.1
(58) Field of Search ............................ 324/73.1, 158.1, 324/126–127, 142, 545, 772; 702/60; 322/99; 318/68, 490, 68 C; 361/86, 93, 31, 93.7; 700/170, 90

(56) References Cited

U.S. PATENT DOCUMENTS

| 720,335 | A | * | 2/1903 | Eastman ...................... 324/105 |
| 1,446,995 | A | * | 2/1923 | Sines .......................... 324/105 |
| 4,032,766 | A | | 6/1977 | Hughes et al. |
| 4,369,354 | A | | 1/1983 | Goedecke et al. |
| 4,584,525 | A | * | 4/1986 | Harnden et al. ............. 324/126 |
| 4,978,909 | A | * | 12/1990 | Hendrix et al. ........... 324/77 B |
| 5,049,815 | A | * | 9/1991 | Kliman ........................ 324/545 |
| 5,234,319 | A | * | 8/1993 | Wilder ......................... 417/40 |
| 5,319,304 | A | * | 6/1994 | Whipple, III ................ 324/142 |
| 5,386,188 | A | | 1/1995 | Minneman et al. |
| 5,514,978 | A | * | 5/1996 | Koegl et al. ................. 324/772 |
| 5,630,325 | A | * | 5/1997 | Bahel et al. .................. 62/222 |
| 5,739,698 | A | * | 4/1998 | Bowers et al. .............. 324/772 |
| 5,804,979 | A | * | 9/1998 | Lund et al. ................. 324/713 |
| 6,128,583 | A | * | 10/2000 | Dowling ...................... 702/58 |

FOREIGN PATENT DOCUMENTS

| DE | 90 13 486.9 | | 1/1991 |
| DE | 40 18 713 | | 12/1991 |
| DE | 195 37 495 | | 3/1997 |
| JP | 405252785 | * | 9/1993 |

* cited by examiner

*Primary Examiner*—Vinh P. Nguyen
(74) *Attorney, Agent, or Firm*—Herbert Dubno

(57) ABSTRACT

The current draw of a pump driven by an electric motor, especially a centrifugal pump such as a heating-system circulating pump, is measured by detecting the voltage drop across a conductor segment connecting the power side and hence the power line to the motor control circuit. This eliminates the need for a separate measurement resistor.

11 Claims, 3 Drawing Sheets

METHOD AND APPARATUS FOR CURRENT MEASUREMENT FOR ELECTRONICALLY-CONTROLLED PUMP

FIELD OF THE INVENTION

My present invention relates to a determination of the current draw of an electronically-controlled pump and to a pump provided with such a current-draw measurement.

BACKGROUND OF THE INVENTION

Pumps, especially electronically-controlled centrifugal pumps, can be driven by an electric motor having a motor control circuit and supplied with power by a conventional power line. The operation of the pump can be monitored, inter alia, by measuring the current draw of the pump as a measure of the loading of the motor and, therefore, the loading of the pump. Other operating parameters can be monitored also for this and other pump operation purposes.

If an increase of the current draw is detected, that can represent an increased loading of the pump which may signal an overload and require the pump to be shut down. The pump may have an emergency shutdown circuit which can respond to that overload or potential overload. It is also possible to use the information, i.e. the current draw, for control of the pump speed or for other purposes.

In the past it has been common to provide within the motor control circuit a resistor, usually connected between the power line and the input terminal of the motor, i.e. in the power part of the circuit, and to measure the voltage drop across this resistor as an indication of the current drawn by the power section and hence by the motor.

Such a measurement resistor has the drawback that it is an extra component which must be introduced at additional coot and must be mounted on the circuit board or the like in additional soldering steps. Since there is a continuing desire for simpler and inexpensive pumps, the provision of additional elements such as special measurement resistors and devices for tapping a voltage across such resistors, runs counter to the principle of simplification. Furthermore, special resistors as have been provided heretofore, contribute to power loss, undesirable heating of the electronic circuitry and, especially for continuously operating pumps, to significantly increase costs. The current which must be supplied is likewise increased and this can require the wiring for the pump to be more massive than is desirable.

OBJECTS OF THE INVENTION

It is, therefore, the principal object of the present invention to provide a method of determining the current draw of a pump which can provide both high accuracy and in a simple manner, measurement of the current draw while nevertheless minimizing the operating and fabricating cost of the pump.

It is another object of the invention to provide an improved pump which can be fabricated relatively inexpensively and operated inexpensively but which will nevertheless allow measurement of the current draw.

A further object of this invention is to provide a method of and an apparatus for measuring the current draw of a pump without the drawbacks of earlier systems or with mitigation of such drawbacks so that, for example, power losses are minimized.

SUMMARY OF THE INVENTION

These objects are achieved, in accordance with the invention, in a method of determining a current draw of a pump driven by an electric motor having a power line and a motor-control circuit connected to the power line, the method comprising the steps of:

(a) measuring a voltage drop across at least a portion of a conductor having a definite resistance and connecting the power line with the motor-control circuit; and (b) calculating the current draw from the voltage drop.

The pump assembly, according to the invention, can comprise:

an electric motor having a power line connected thereto for energizing the electric motor;

a motor control circuit connected to the motor and the power line for electronically controlling the pump assembly;

a pump driven by the motor; and means for measuring a voltage drop across at least a portion of a conductor having a definite resistance and connecting the power line with the motor control circuit and calculating the current draw from the voltage drop.

According to the invention, therefore, a segment of a conductor between the control electronics, i.e. the motor control circuit, and the power line is used as the voltage drop segment and the voltage drop is detected across this segment and the output of the detector is converted into a measurement of the current. As a consequence it is not necessary to solder a separate component such as a measuring resistor into the pump and is hence for the measurement of the current no additional fabricating costs are involved.

In small circulating pumps for heating purposes, this can amount to a saving of about 2% when, instead of the extra resistance, a segment of the connecting conductor, which is customarily provided, is used. It is, of course, self-understood that the resistance of the wire segment used for measurement should be known and hence defined. The use of the connecting conductor makes the separate incorporation of the measuring resistor superfluous and therefore simplifies fabrication as well.

The use of the connecting conductor segment has made the reliability of the measurement and thus the reliability of the pump greater since the system eliminates a separate component which can be an additional error source. The elimination of a measurement resistor, moreover, eliminates a component which can decrease the efficiency of the pump, give rise to undesired heating in the pump or in the electronic circuitry, and pose problems with respect to positioning, mounting and the like. The space required for electronic circuitry and hence the pump dimensions can be held low since the additional component is not required and that permits the pump to be used in limited environments. The invention is particularly advantageous for small pumps in circulating hot-water systems.

An especially precise current measurement is possible when a processor, especially a microprocessor or microcomputer, in incorporated in the motor control circuit and is used to detect the voltage drop over the segment of the connecting conductor. Such a microcomputer can calculate in an especially simple way the current drawn by the pump from the value of the current determined in the conductor segment. Furthermore, the microcomputer can permit factors which may influence the measurement of the current draw, such as the temperature of the conducting segment or the influence of the motor-control circuit on the current drop to be taken into consideration. The consideration of such factors is important since a relatively small current in the motor-control circuit is used to indirectly provide a measurement to the much larger current draw.

It has been found to be especially advantageous to use a segment of the connecting conductor which itself has a well-defined resistance and can be composed from so-called resistance wire, namely, a wire having a predetermined specific resistance, this resistance wire can be cut to a predetermined length and used in the pump circuitry. Such resistance wires have within a temperature range an entirely predictable relationship between current flow and voltage drop so that the temperature characteristic of the wire segment can be programmed into the microcomputer as a data set or as a correction instruction for calculating the current.

In an especially advantageous embodiment the conductor is cold-soldered or bonded between a plug contact to which the power line is connected and the printed circuit board of the motor control circuit and can have a resistance of about 1–5 mΩ.

BRIEF DESCRIPTION OF THE DRAWING

The above and other objects, features, and advantages will become more readily apparent from the following description, reference being made to the accompanying drawing in which.

SPECIFIC DESCRIPTION

Figures 1A, 1B:
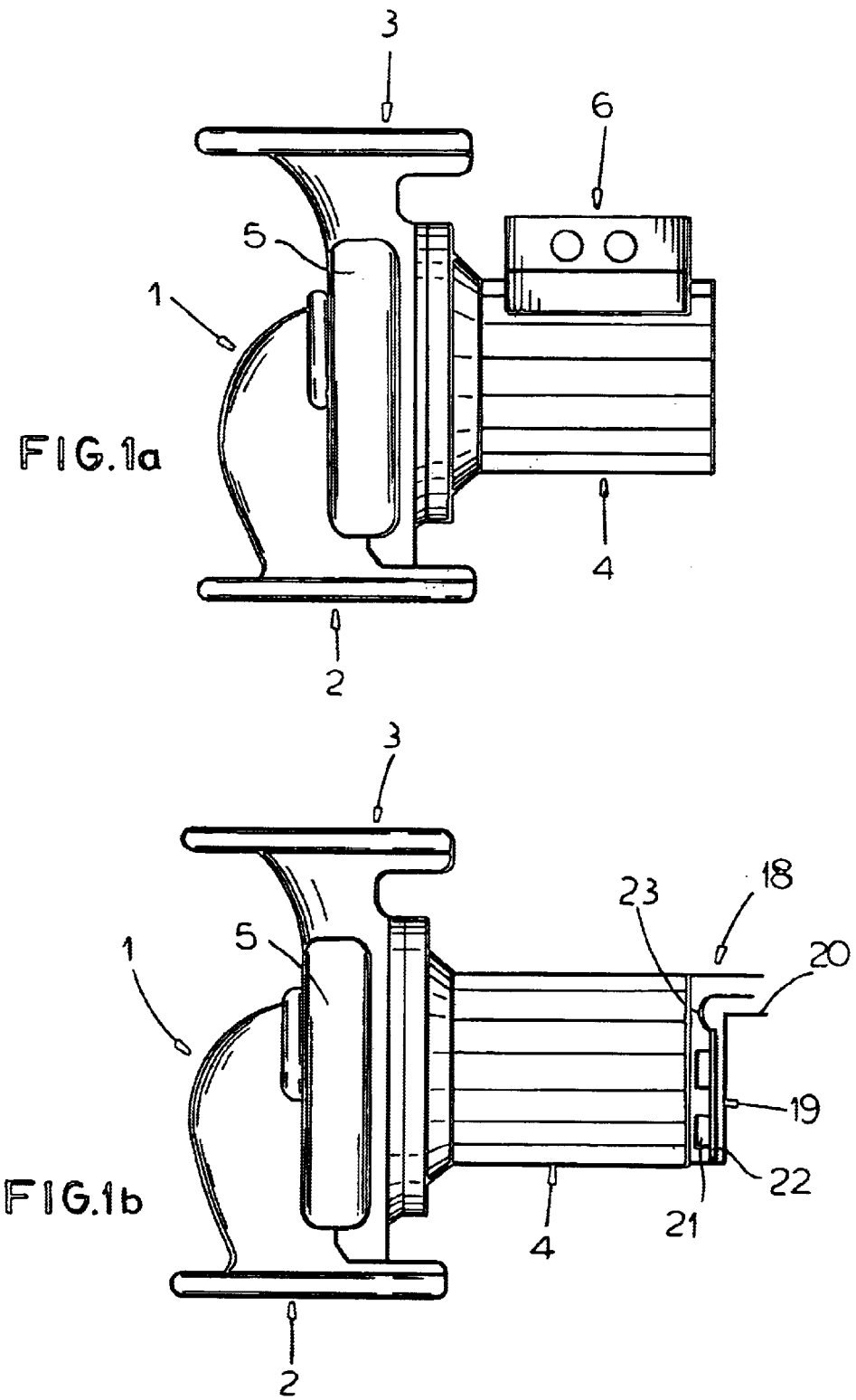
FIG. 1a is an elevational view of a circulating pump incorporating the invention.
FIG. 1b is a view similar to FIG. 1a of another embodiment of the circulating pump partly broken away.

FIG. 1a shows a centrifugal pump 1 in the form of a hot-water circulating pump for a hot-water heating system which has an inlet 2, an outlet 3 and a pump housing 5 connected to the housing of a motor 4. The usual impeller or rotor of the pump is provided in the housing 5. The electric connection to the pump 1 is effected via a terminal box 6 which can include the motor control circuitry 8 (FIG. 3) and the connectors for the power supply, referred to here as the power circuit 7.

FIG. 1b shows a similar pump without the terminal box 6 but with a direct connection 18 between the power line and the motor housing 4. In this case, the motor control circuitry is provided in a compartment 19 attached axially to the motor housing and having a plug 20 for connection to the power line. In the housing 19 the electronic components 21 are provided on a ceramic support or printed circuit board 22 which has a wire segment 23 soldered to the plug 20 and the printed circuit board 22 and serving as the connecting segment between the power line and the motor control circuit.

Figure 2:
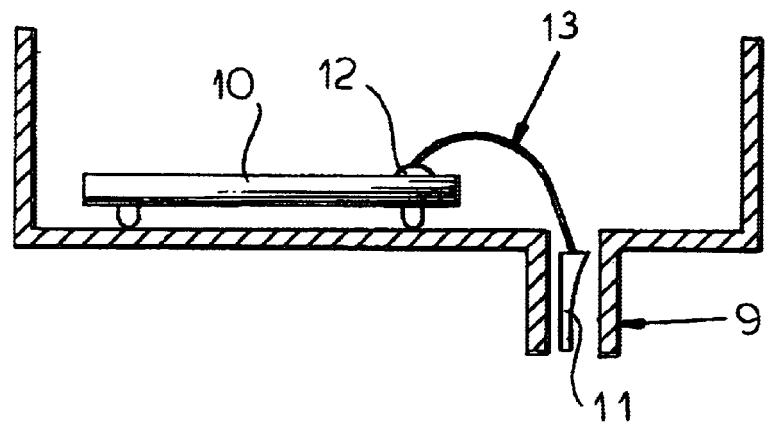
FIG. 2 is a diagrammatic cross sectional view showing a bonded conductor.

The embodiment of FIG. 2 shows a section through the terminal box 6 which has a foot 9 mounting it to the motor housing. In the box 9 the printed circuit board 10 carries the motor control circuit and a plug contact 11 is provided in the power circuit running to the winding of the motor 4. Between the plug contact 11 and the terminal 12 of the printed circuit board 10, a wire segment 13 is provided with a bonded wire. The bonded wire 13 has in this case a resistance of 2–3 mΩ and is used for the current measurement.

Figure 3:
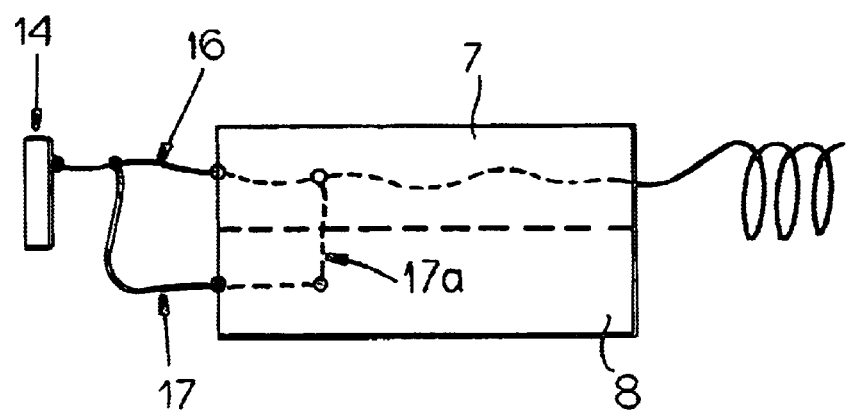
FIG. 3 in a diagram illustrating the invention.

The principle of the invention is shown in FIG. 3 where a power connector 14 has a power conductor or power line 16 running to the power electronics or motor control circuit 7 of the motor and a conductor segment 17a bridges the power section and the motor-control section 8. The segment 17a is connected via a line 17 supplying the motor-control circuit. The measurement resistance is here the segment 17a shown in broken lines.

Figure 4:
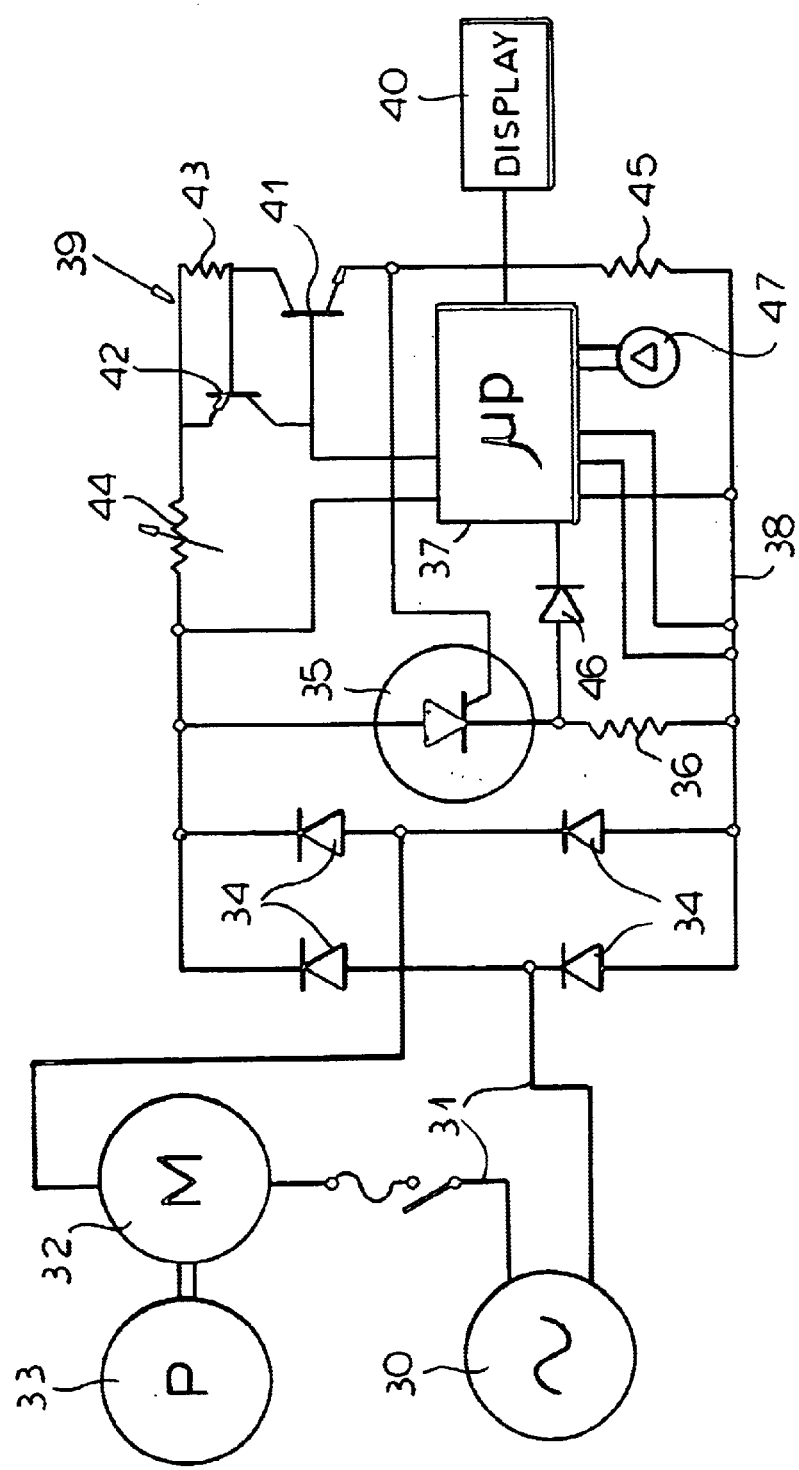
FIG. 4 is a more detailed circuit diagram showing principles of the invention.

More particularly, the power source can be seen with a line current 30 in FIG. 4 and can have a power line 31 connected to the power electronic motor control circuitry shown in heavy lines in FIG. 4 and thus to the motor 32 driving the pump 33 and, in particular, to the motor windings. The power circuitry can include the rectifiers 34 forming a standard bridge and a thyristor 35 controlling the motor operation and connected via a resistor 36 to one side of the power line. A microcomputer, processor or computer unit 37 is bridged across the segment 38 of the conductor supplying the motor control circuitry 39 to detect the voltage drop thereacross and provide a measurement of the current draw of the motor 32. That output may be used to cut off the operation of the motor in the case of an overload or as the basis of a display 40.

The motor-control circuitry can provide signals operating the thyristor as a chopper for the sine wave input voltage and including the standard transistors 41 and 42 and bias resistors 43, 44 and 45. A diode 46 is provided between the anode of the thyristor 35 and the microprocessor. Apart from the use of the circuitry of FIG. 4 to detect the current draw, the system is a conventional motor-control system. A temperature sensor such as a thermocouple can be provided at 47 to provide an input to the microprocessor for correction of the current measurement as a function of the temperature of the sensing segment 38 of the conductor connecting the power side of the system to the motor-control circuit.

I claim:

1. A method of determining a current draw of a pump driven by an electric motor, and a motor control circuit being connected to said motor by a power line said method comprising the steps of:

(a) measuring a voltage drop across at least a portion of a conductor having a definite resistance and connecting said power line with said motor-control circuit; and (b) calculating said current draw from said voltage drop.

2. The method defined in claim 1 wherein said portion of said conductor having said resistance is a piece of current supply line connecting the power line with said motor-control circuit.

3. The method defined in claim 1 wherein the voltage drop is measured and the current draw is calculated from said voltage drop by a computing unit forming part of said motor-control circuit.

4. The method defined in claim 1 wherein a current measured in said portion of said conductor is converted into a current draw of said pump.

5. The method defined in claim 1 wherein in calculating said current draw from said voltage drop, a computer unit forming part of said motor control circuit compensates for a temperature of said portion of said conductor.

6. An electronically controlled pump assembly comprising:

an electric motor having a power line connected thereto for energizing said electric motor;

a motor control circuit connected to said motor and said power line for electronically controlling said pump assembly;

a pump driven by said motor; and means for measuring a voltage drop across at least a portion of a conductor in the form of a wire segment having a definite resistance and connecting said power line with said motor control circuit and calculating said current draw from said voltage drop.

7. The assembly defined in claim 6 wherein said portion of said conductor is a piece of resistance wire with a known specific resistance and a defined length.

8. The assembly defined in claim 6 wherein said portion of said conductor is a bridge between a plug contact to which said power line is connected and a printed circuit board carrying said motor control circuit, said bridge having a defined resistance.

9. The assembly defined in claim 6 wherein said resistance is between 1 and 5 m$\Omega$.

10. The assembly defined in claim 6, further comprising a processor forming part of said motor control circuit and constituting the means for measuring and calculating.

11. The assembly defined in claim 10 wherein said processor is provided to effect a regulatory action in response to the temperature of said portion of said conductor.

* * * * *